United States Patent [19]

Miyake et al.

[11] Patent Number: 5,677,385
[45] Date of Patent: Oct. 14, 1997

[54] PHOTO-SETTING COLORED FILTER COMPOSITION, A COLOR FILTER, A PROCESS FOR THE PREPARATION THEREOF, AND A CURABLE RESIN COMPOSITION

[75] Inventors: Hiroto Miyake, Ohtake; Koichi Okumura, Matsudo; Toshio Endo, Ohtake, all of Japan

[73] Assignee: Daicel Chemical Industries, Ltd., Tokyo, Japan

[21] Appl. No.: 783,619

[22] Filed: Jan. 14, 1997

Related U.S. Application Data

[62] Division of Ser. No. 582,190, Jan. 2, 1996.

[30] Foreign Application Priority Data

Jan. 5, 1995 [JP] Japan .................... 7-000183
Mar. 20, 1995 [JP] Japan .................... 7-087479

[51] Int. Cl.⁶ ......................................... C08F 8/00
[52] U.S. Cl. .................. 525/286; 525/327.3; 522/122
[58] Field of Search ................ 525/286, 327.3; 522/122

[56] References Cited

U.S. PATENT DOCUMENTS

| | | | |
|---|---|---|---|
| 5,126,394 | 6/1992 | Revis et al. | 524/548 |
| 5,225,473 | 7/1993 | Duan | 524/548 |
| 5,232,634 | 8/1993 | Sawada et al. | 252/584 |
| 5,296,530 | 3/1994 | Bors et al. | 524/548 |

*Primary Examiner*—Bernard Lipman
*Attorney, Agent, or Firm*—Morgan & Finnegan, LLP

[57] ABSTRACT

Disclosed are a photo-setting colored filter composition, a color filter, a process for the preparation thereof, a curable resin, and a curable resin composition. The photo-setting colored filter composition of the present invention has an excellent photo-curability, miscibility in the composition, and developability.

The curable resin composition is excellent in stability of the composition, tackiness, developability, sensitivity, anti-strippability, and hydrolysis resistance compared to conventional curable resin compositions.

6 Claims, 1 Drawing Sheet

Figure 1

PHOTO-SETTING COLORED FILTER COMPOSITION, A COLOR FILTER, A PROCESS FOR THE PREPARATION THEREOF, AND A CURABLE RESIN COMPOSITION

This a divisional of co-pending application Ser. No. 08/582,190 filed Jan. 2, 1996.

FIELD OF THE INVENTION

The present invention relates to a photo-setting colored filter composition. Furthermore, the present invention relates to a color filter.

Still further, the present invention relates to a process for the preparation thereof. The photo-setting colored filter composition of the present invention has an excellent photo-curability, miscibility in the composition, and developability.

In addition, the present invention relates to a curable resin and a curable resin composition which can be employed as a resin for a photo-solder resist or a resin for a photo-setting colored filter composition with which resist patterns can be formed by exposing to an ultraviolet ray and can be developed by a diluted aqueous alkali solution after coating. The curable resin and the composition according to the present invention are excellent in solubility and developability.

BACKGROUND OF THE INVENTION

Recently, a liquid crystal display device has tended to become large-sized, and perfection and a thin-layer type are required in a color filter to be employed in the device.

Furthermore, good optical clarity and patterns with high resolution are also required. Still further, there is required the decrease of costs for the preparation of the color filter. For that reason, there inevitably requires an improvement of yield and productivity.

A color filter is composed of a transparent substrate such as a glass plate on which there are coated layers having pixel elements containing essential three primary colors and optional black color by triangular array, mosaic array, and stripe array, particularly, pixel elements for a charge connection device (CCD) require patterns with high resolution, for example, from submicrons to tens of microns.

Furthermore, pixel elements for a liquid crystal display device (LCD) require patterns with high resolution, for example, from tens of microns to two hundreds microns or so, and the pixel elements require systematical arrays according to the fixed order of each of every colors in the essential three primary colors and optional black color.

Heretofore, color filters have been prepared by repeating a process in which there is coated a photo-setting colored filter composition onto a transparent substrate such as a glass plate, and then the layer formed by coating is developed by exposing to photo-energy after drying, and further removing unexposed portions by organic solvents or aqueous alkali solutions in order to fix patterns.

It is to be noted that the photo-setting colored filter composition includes coloring materials such as pigments or dyes, a photo-curable resin which is a medium for dispersing the coloring materials, additionally polymerizable monomers and/or oligomers and, optionally, dispersants for the pigments. At the present time, aqueous alkali solutions are mainly employed in dissolving from a viewpoint of environmental protection.

As the photo-curable resin, acrylic-based resins have been employed because of excellent weatherability and minor change in colors. For example, Japanese Patent Unexamined Publication (Kokai) No. 53201/1993 (corresponding to U.S. Pat. No. 5,232,634) discloses a photo-setting colored filter composition comprising a (meth)acrylic resin, multi-functional acrylates such as trimethylolpropane triacrylate, pigments, dispersants, and photo-initiators. However, although the photo-setting colored filter composition is excellent in weatherability, there are insufficient properties such as alkali resistance in a coated layer, solvent resistance, and moisture resistance after curing because the acrylic resin itself which is a medium for dispersing the pigments cannot be cured.

Furthermore, Japanese Patent Unexamined Publication (Kokai) No. 230212/1994 discloses a photo-setting colored filter composition comprising photo-curable resins in which double bonds are introduced into acrylic resins having hydroxyl groups through a diisocyanate compound, pigments, and photo-initiators.

The photo-setting colored filter composition can provide cured layers having an excellent alkali resistance and solvent resistance owing to capability of curing in the acrylic resin itself which is a binder.

However, as the photo-setting colored filter composition containing the acrylic resins exhibits tackiness even after removal of solvents, there has been a problem that a photographic mask often becomes dirty during exposing to photo-energy.

In the case when there is decreased the amount of monomers or oligomers for diluting mixed in order to decrease tackiness, photo-curability and resolution cannot be sufficiently obtained.

On the other hand, a solder resist composition does not contain coloring materials compared to the photo-setting colored filter composition. It is usually employed for preparing a permanently protecting layer onto a printed circuit board. In the circuit board, the solder resist composition is coated onto all residual portions except portions to be soldered in electrically-conductive portions in order to prevent oxidation and corrosion of the circuit together with preventing unpreferred blot by solder.

As a process for protecting a printed circuit board by a layer formed from a solder resist composition, there is known a process in which a thermosetting type resist ink is printed by a screen printing method, and then the printed resist ink is thermally cured or cured by an ultraviolet ray. However, during being printed, the resist ink printed by a screen printing method causes bleeding, blotting, and flowing, resulting in that it is not appropriate for coatings onto a recent large-scale integrated circuit board.

In order to solve the problems, a photographic process was thought out in which layer formed from a solder resist composition is exposed to light through a photographic film having a fixed pattern, and then the layer is developed with a developer to form a desired pattern.

The solder resist composition employed in the photographic process, that is, a photographic solder resist composition includes a dry-film type and liquid-type photographic solder composition. Layer formed from the dry-film type composition readily causes foams, and it includes anxiety in thermal stability and anti-strippability and expensive costs.

Accordingly, the liquid-type photographic solder resist composition is primarily employed at the present time.

It is to be noted that organic solvents have been conventionally employed as a developer in the process using the liquid-type photographic solder resist composition. However, from a viewpoint of environmental protection, there is thought out a process in which a diluted aqueous alkali solution is employed as a developer. As a photographic solder resist composition developed by a diluted aqueous alkali solution, JP-61243869-A discloses a liquid type solder resist composition which comprises a compound obtained by an addition reaction of a polybasic anhydride with a reaction compound between a novolak type epoxy compound and an unsaturated monocarboxylic acid. The liquid type solder resist composition is excellent in thermal stability.

However, it exhibits tackiness even in the completion of predrying in order to remove solvents. Predrying at higher temperatures partially causes curing of the composition, unpreferably resulting in that developability becomes worse after exposed to light. Furthermore, the novolak type epoxy compound can not be readily modified, unpreferably resulting in that various demands of properties for a resist composition are not satisfied.

Furthermore, JP-01139619-A discloses a photographic solder resist composition which comprises a compound obtained by an addition reaction of glycidyl(meth)acrylate with an acrylic resin having a high acid value. Although the compound is excellent also in predrying properties because main chains in the acrylic structure can be freely modified, it is insufficient in basic properties such as curability and developability as a photographic solder resist composition.

Still further, it is difficult to control the reaction between carboxylic group and epoxy group, unpreferably resulting in increasing viscosity or readily causing gelation.

In addition, JP-01289820-A discloses a curable resin composition mixing a compound obtained by an addition reaction of a (meth)acrylate having an alicyclic epoxy group in place of glycidyl(meth)acrylate with an acrylic resin having a high acid value. However, in the case when the curable composition is employed as a solder resist developed by an alkali, it is exceedingly poor in developability by an alkali because of insufficient solubility in an alkali. Furthermore, in the curable composition, there is a problem that there is caused separation of components when being stored because of poor solubility in monomers or oligomers for diluting and with inorganic fillers.

In order to solve the disadvantages in the prior arts, as a result of extensive investigations, the present inventors have now completed the present invention.

SUMMARY OF THE INVENTION

It is an object of the present invention to provide a photo-setting colored filter composition having an excellent ultraviolet curability, miscibility in the composition, and developability.

It is another object of the present invention to provide a color filter to be employed as a liquid crystal color display, a color video camera, and an imaging scanner, etc.

It is a third object of the present invention to provide a processes for the preparation thereof.

It is a fourth object of the present invention to provide a curable resin.

It is a fifth object of the present invention to provide a curable resin composition.

A first aspect of the present invention relates to a photo-setting colored filter composition which comprises a (meth) acrylic resin having unsaturated groups obtained by a reaction of a resin having carboxylic groups with a compound having an alicyclic epoxy group and a (meth)acrylic group, photo-initiators, coloring materials, and optionally dispersants for the coloring materials, copolymerizable monomers and/or prepolymers, and solvent.

A second aspect of the present invention relates to a color filter comprising;
  a) a substrate having a surface portion, wherein said substrate is formed of a transparent material selected from the group consisting of glass and synthetic resin; and
  b) a multiplicity of color filter elements distributed in a predetermined pattern on said surface portion of said substrate, each of the color filter elements being formed of a photo-setting colored filter composition containing a (meth)acrylic resin having unsaturated groups obtained by a reaction of a resin having carboxylic groups with a compound having an alicyclic epoxy group and a (meth)acrylic group, a coloring material and a dispersant.

A third aspect of the present invention relates to a process for the preparation of a color filter which comprises the steps of;
  (a) mixing a (meth)acrylic resin having unsaturated groups obtained by a reaction of a resin having carboxylic groups with a compound having an alicyclic epoxy group and a (meth)acrylic group, coloring materials, and additionally copolymerizable monomers and/or prepolymers, dispersants, and a solvent to prepare a dispersed liquid,
  (b) adding photo-initiators to the dispersed liquid to produce a photo-setting colored filter composition,
  (c) forming a layer of the colored filter composition on the surface of a transparent substrate,
  (d) selectively exposing the layer to photo-energy and developing the resultant layer for forming a multiplicity of discrete filter regions of the photo-setting colored filter composition distributed in a desired pattern on the surface of the transparent substrate.

A fourth aspect of the present invention relates to a curable resin which comprises a (meth)acrylic resin having unsaturated groups obtained by a reaction of a polymer having structural units represented by general formula (I);

wherein $R^1$ is a hydrogen atom or methyl group, $R^2$ is an alkylene radical having a carbon number ranging from 2 to 12, $R^3$ is a divalent radical having a carbon number ranging from 1 to 10, $R^4$ is a hydrocarbon group having a carbon number ranging from 1 to 20 which may be branched, n is an integer ranging from 1 to 20, and m is an integer ranging from 1 to 5, with a compound having an alicyclic epoxy group and a (meth)acrylic group.

A fifth aspect of the present invention relates to a resin of the fourth aspect, a radical polymerization initiator or photo-initiator and, optionally, copolymerizable monomers and/or oligomers, and solvents.

DETAILED DESCRIPTION OF THE INVENTION

The present invention will be described hereinafter in more detail.

According to a first aspect of the present invention, there is provided a photo-setting colored filter composition which comprises a (moth)acrylic resin having unsaturated groups obtained by a reaction of a resin having carboxylic groups with a compound having an alicyclic epoxy group and a (meth)acrylic group, photo-initiators, coloring materials, and optionally dispersants for the coloring materials, copolymerizable monomers and/or prepolymers, and solvent.

There is firstly described in detail the (moth)acrylic resin having unsaturated groups to be employed in the present invention.

The (meth)acrylic resin having unsaturated groups to be employed in the present invention can be prepared by the reaction of a resin having carboxylic groups with a compound having an alicyclic epoxy group and a (meth)acrylic group.

The resin having carboxylic groups can be prepared by the (co)polymerization of a carboxylic acid having an unsaturated group with other optional polymerizable monomers.

The carboxylic acid having an unsaturated group includes acrylic acid, methacrylic acid, crotonic acid, maleic acid, itaconic acid, fumaric acid, and a modified carboxylic acid having an unsaturated group in which there is extended a chain between unsaturated group and carboxylic group such as, for example, betacarboxyethyl(meth) acrylate, an unsaturated carboxylic acid having lactone-modified ester bonds, and an unsaturated carboxylic acid having ether bonds.

As the modified carboxylic acid having an unsaturated group, there is also included a compound represented by the following general formulae (II) or (III).

CH₂=CR¹—COO(R³CO)n—OH　　(II)

CH=CR¹—COOR²O(COR³O)n—COR⁴(COOH)m　　(III)

wherein $R^1$ is a hydrogen atom or methyl group, $R^2$ is an alkylene radical having a carbon number ranging from 2 to 12, $R^3$ is a divalent radical having a carbon number ranging from 1 to 10, $R^4$ is a hydrocarbon group having a carbon number ranging from 1 to 20, preferably from 1 to 10, more preferably from 1 to 5 which may be branched, n is an integer ranging from 1 to 20, and m is an integer ranging from 1 to 5.

As the compound represented by the general formula (III), there is included an acid-modified compound in which terminated hydroxyl group in a hydroxyalkyl(meth)acrylate modified by a lactone compound is further modified by a polybasic acid or anhydride thereof.

As the hydroxyalkyl(meth)acrylate to be employed, there are included 2-hydroxyethyl (meth)acrylate, 2-hydroxypropyl(meth)acrylate, 2-hydroxybutyl (meth) acrylate, and 2-hydroxypentyl (meth)acrylate.

As the lactone compound to be employed, there are included delta-valerolactone, beta-methyl-delta-valerolactone, epsilon-caprolactone, 3,3,5-trimethylcaprolactone, 3,5,5-trimethyl caprolactone.

As the polybasic acid or anhydride thereof to be employed, there are included maleic acid, phthalic acid, trimellitic acid, pyromellitic acid, itaconic acid, tetrahydrophthalic acid, hexahydrophthalic acid, oxalic acid, adipic acid, fumaric acid, malonic acid, glutaric acid, pimelic acid, azelaic acid, sebasic acid, sberic acid, and anhydrides thereof.

The polybasic acid or anhydride thereof may be employed solely or in combination.

The compound represented by the general formula (III) is disclosed in, for example, U.S. Pat. Nos. 4,680,361, 4,786,749, 4,812,549, and 4,883,899.

It is to be noted that the compound represented by the above-described general formula (III) is an essential component in fourth aspect of the present invention.

As the other optional polymerizable monomers to be employed, there are included an alkylacrylate such as methylacrylate, ethylacrylate, isopropyl acrylate, n-butylacrylate, 2-ethylhexylacrylate, an alkylmethacrylate such as methylmethacrylate, ethylmethacrylate, isopropylmethacrylate, n-butylmethacrylate, isobutylmethacrylate, n-hexylmethacrylate, 2-ethylhexylmethacrylate, lauryl methacrylate, glycidylacrylate, glycidylmethacrylate, acrylonitrile, methacrylonitrile, acrylamide, methacrylamide, an aminoalkyl methacrylate such as aminomethyl methacrylate, amino N-methylmethacrylate, amino N,N-dimethylmethacrylate, an aminoalkyl acrylate such as aminomethylacrylate, amino N-methylacrylate, aminoethyl N,N-dimethylacrylate, a styrenic monomer such as styrene, vinyltoluene, alphamethylstyrene, and vinylacetate, etc. Furthermore, there can be also employed a monoethylenic unsaturated monomer having hydroxyl group according to circumstances. The monoethylenic unsaturated monomer having hydroxyl group includes a hydroxyalkyl(meth)acrylate such as 2-hydroxyethyl(meth)acrylate, 2-hydroxypropyl(meth)acrylate, 2-hydroxybutyl(meth)acrylate, 2-hydroxypentyl(meth)acrylate, and a lactone-modified product thereof.

In the resin having carboxylic groups, the mixing ratio of the a carboxylic acid having an unsaturated group to the other optional polymerizable monomers can be widely selected depending upon the amount of double bonds to be introduced into the (meth)acrylic resin having unsaturated groups and an acid value to be fixed.

The mixing ratio is selected so that an acid value in the resin having carboxylic groups ranges from 50 to 650 KOHmg/g, more preferably ranges from 200 to 530 KOHmg/g.

In the case when the acid value is below 50 KOHmg/g, there cannot be allowed to react a large amount of the compound having an alicyclic epoxy group and a (meth)acrylic group, resulting in that there cannot be obtained satisfied properties in the (meth)acrylic resin having unsaturated groups. On the other hand, in the case when the acid value exceeds 650 KOHmg/g, solvents to be employed are limited.

The resin having carboxylic groups can be prepared without any limitations. For example, there is preferred a polymerization process in appropriate solvents which is a solution polymerization because of easiness of the reaction.

The solution polymerization is carried out by the following steps. For example, the solvent is mixed with polymerization initiators in a reaction vessel and heated at a temperature ranging from 50° to 150° C., followed by adding dropwise a mixture composed of monomers and Polymerization initiators over 2 to 5 hours and by heating for 2 to 10 hours.

The solvents capable of dissolving the monomers and resulting (meth)acrylic polymer can be employed without any limitations. As the solvents, there are specifically included an aromatic hydrocarbon such as benzene, toluene, and xylene, alcohols, such as methanol, ethanol, and 2-propanol, and the like, ketones such as acetone, methylethylketone, and methyl isobutylketone, and the like, ethers such as diethylether, dibutylether, and dioxane, and the like, esters such as ethyl acetate, isobutyl acetate, ethyleneglycol monoacetate, propyleneglycol monoacetate, dipropyleneglycol monoacetate, ethyleneglycol monoalkylethers, diethyleneglycol monoalkylethers propyleneglycol monoalkylethers, dipropyleneglycol monoalkyl ethers, ethyleneglycol dialkylethers, diethyleneglycol dialkylethers such as diethyleneglycol dimethylether and diethyleneglycol diethylether, ethyleneglycol monoalkylether acetates, diethyleneglycol monoalkyletheracetates, amides such as dimethylformamide and dimethylacetoamide, halogenated hydrocarbons such as carbon tetrachloride and chloroform, etc.

The solvents may be employed solely or in combination.

As the polymerization initiators, there can be employed a conventional polymerization initiators which include azo-based nitriles such as 2,2'-azobisisobutyronitrile, 2,2'-azobis (2,4-dimethylvaleronitrile), peroxides such as lauroyl peroxide, di-t-butylperoxide, bis(4-t-butylcyclohexyl) peroxydicarbonate, t-butylperoxy (2-ethylhexanoate), methylethylketone peroxide, benzoylperoxide, cumenhydroperoxide, etc. The polymerization initiators may be employed solely or in combination.

Molecular weight of the resin having carboxylic groups depends upon polymerization temperature, the amount and kind of the polymerization initiators, the dropwise addition speed of monomers and the polymerization initiators, and the amount and kind of the solvents, etc.

The molecular weight of the resin having carboxylic groups is adjusted so that the (meth)acrylic resin having unsaturated groups has a number average molecular weight of 1,000 to 50,000.

Carboxylic groups in thus-obtained resin having carboxylic groups are allowed to partially or completely react with a compound having an alicyclic epoxy group and a (meth) acrylic group.

The compound having an alicyclic epoxy group and a (meth)acrylic group to be employed in the present invention includes compounds as described below.

(IV)

wherein $R^1$ is a hydrogen atom or —$CH_3$, (V)

wherein $R^1$ is a hydrogen atom or —$CH_3$, $R^2$ is an alkylene group having a carbon number ranging from 1 to 10, (VI)

wherein $R^1$ is a hydrogen atom or —$CH_3$, $R^2$ is an alkylene group having a carbon number ranging from 1 to 10, (VII)

wherein $R^1$ is a hydrogen atom or —$CH_3$, $R^2$ is an alkylene group having a carbon number ranging from 1 to 10, $R^3$ is a residual group of hydrocarbon having a carbon number ranging from 1 to 10, and k is 0 or an integer ranging from 1 to 10, (VIII)

wherein $R^1$ is a hydrogen atom or —$CH_3$, $R^2$ is an alkylene group having a carbon number ranging from 1 to 10, (IX)

wherein $R^1$ is a hydrogen atom or —$CH_3$, $R^2$ is an alkylene group having a carbon number ranging from 1 to 10, (X)

wherein $R^1$ is a hydrogen atom or —$CH_3$, $R^2$ is an alkylene group having a carbon number ranging from 1 to 10, (XI)

wherein $R^1$ is a hydrogen atom or —$CH_3$, $R^2$ is an alkylene group having a carbon number ranging from 1 to 10, (XII)

wherein $R^1$ is a hydrogen atom or —$CH_3$, $R^2$ is an alkylene group having a carbon number ranging from 1 to 10, $R^3$ is a residual group of hydrocarbon having a carbon number ranging from 1 to 10, and k is 0 or an integer ranging from 1 to 10, (XIII)

wherein $R^1$ is a hydrogen atom or —$CH_3$, $R^2$ is an alkylene group having a carbon number ranging from 1 to 10, $R^3$ is a residual group of hydrocarbon having a carbon number ranging from 1 to 10, and k is 0 or an integer ranging from 1 to 10, wherein R¹ is a hydrogen atom or —CH₃, R² is an alkylene group having a carbon number ranging from 1 to 10, wherein R¹ is a hydrogen atom or —CH₃, R² is an alkylene group having a carbon number ranging from 1 to 10, wherein R¹ is a hydrogen atom or —CH₃, R² is an alkylene group having a carbon number ranging from 1 to 10, wherein R¹ is a hydrogen atom or —CH₃, R² is an alkylene group having a carbon number ranging from 1 to 10, wherein R¹ is a hydrogen atom or —CH₃, wherein R¹ is a hydrogen atom or —CH₃.

Of those, there can be most preferably employed 3,4-epoxycyclohexyl methyl(meth)acrylate which is one of the compounds represented by the general formula (VI).

The compounds represented by formulae (IV) to (XIX) can be employed solely or in combination.

Furthermore, there can be employed an unsaturated compound having aliphatic epoxy group such as glycidyl(meth)acrylate, beta-methylglycidyl (meth)acrylate, allylglycidylether, and the like, within 80% by weight based on the above-described compounds having an alicyclic epoxy group and a (meth)acrylic group.

In the case when the unsaturated compound having aliphatic epoxy group exceeding 80% by weight is mixed, there grow worse hydrolysis resistance and tackiness in the (meth)acrylic resin having unsaturated groups.

The unsaturated compound having aliphatic epoxy group is employed in the amount of double bonds ranging from 1.0 to 4.0 mol, preferably from 1.5 to 3.0 mol based on 1 kg of the (meth)acrylic resin having unsaturated groups.

In the case when the amount of double bonds is below 1.0 mol, sufficient curability cannot be obtained and, contrarily, in the case when it exceeds 4.0 mol, it is anxious that storage stability becomes worse.

Number average molecular weight of the (meth)acrylic resin having unsaturated groups preferably ranges from 1,000 to 50,000, and more preferably from 3,000 to 30,000.

In the case when the number average molecular weight is below 1,000, a thermal stability and strength in coating layer become worse and, contrarily, in the case when it exceeds 50,000, workability and solubility in a solvent become worse.

The reaction between the resin having carboxylic groups and the compound having an alicyclic epoxy group and a (meth)acrylic group is carried out in a temperature ranging from 50° to 150° C. at the presence of catalysts, and at the presence or absence of solvents and polymerization inhibitors.

In the case when the temperature is below 50° C., the reaction period of time becomes lengthened, unpreferably resulting in that productivity becomes worse. Contrarily, in the case when it exceeds 150° C., gelation becomes readily caused in the reaction.

The reaction is preferably carried out at the presence of molecular oxygen which is a polymerization inhibitor. As the molecular oxygen, air is usually supplied into a reaction vessel together with a gas for dilution such as nitrogen.

As the catalysts in the reaction, there are exemplified tertiary amines such as dimethyl benzylamine, triethylamine, tetramethyl ethylenediamine, and tri-n-octylamine, quaternary ammonium salts such as tetramethylammonium chloride, tetramethyl ammonium bromide, and tetrabutyl ammonium bromide, an alkylated urea such as tetramethyl urea, an alkylated guanazine such as tetramethyl guanazine, a tertiary phosphine such as triphenyl phosphine, etc.

The catalysts may be employed solely or in combination.

The catalysts are employed in the amount ranging from 0.01 to 10% by weight, preferably from 0.5 to 4.0% by weight based on the total amount of the compounds having an alicyclic epoxy group and a (meth)acrylic group.

In the case when the amount is below 0.01% by weight, catalytic effect is smaller and, contrarily, the amount exceeding 10% by weight is meaningless.

In thus-obtained (meth)acrylic resin having unsaturated groups, an acid value ranges from 10 to 300 KOHmg/g, and preferably from 20 to 200 KOHmg/g.

In the case when the acid value is below 10 KOHmg/g, unexposed portions cannot be sufficiently removed by a diluted alkali solution and, contrarily, in the case when the acid value exceeds 300 KOHmg/g, there grow worse water resistance, alkali resistance, and moisture resistance in coated layers after curing.

Thus-obtained (meth)acrylic resin having unsaturated groups can be employed by optionally mixing with copolymerizable vinyl monomers and/or copolymerizable prepolymers depending upon properties to be required in the photo-setting colored filter composition of the present invention.

Viscosity in the photo-setting colored filter composition can be decreased and photo-curability can be promoted by mixing with the monomers and/or prepolymers.

As the copolymerizable vinyl monomers, there are included acrylic or methacrylic esters, vinyl aromatic monomers such as styrene, and unsaturated amide compounds, etc. which are typical compounds having radically polymerizable double bonds.

As specific examples of the acrylic or methacrylic esters, there are exemplified alkyl (meth)acrylates such as methyl (meth)acrylate, ethyl(meth)acrylate, propyl(meth)acrylate, butyl(meth)acrylate, pentyl(meth)acrylate, and hexyl(meth) acrylate, (meth)acrylates having hydroxyl group such as 2-hydroxyethyl(meth)acrylate, hydroxypropyl(meth) acrylate, hydroxybutyl (meth) acrylate, and lactone-modified products thereof, (meth)acrylates such as ethoxy-diethyleneglycol (meth)acrylate, ethoxydiethyleneglycol (meth)acrylate, isooctyloxydiethyleneglycol(meth)acrylate, phenoxytriethyleneglycol(meth)acrylate, triethyleneglycol di(meth)acrylate, methoxytriethyleneglycol (meth)acrylate, and methoxypolyethyleneglycol =400(meth)acrylate, bifunctional (meth)acrylates such as 1,6-hexanediol di(meth)acrylate, neopentylglycol di(meth)acrylate, bis (acryloxyethoxy)bisphenol A, 3-methylpentanediol di(meth)acrylate, trifunctional (meth) acrylates such as trimethylolpropane tri(meth)acrylate, tetrafunctional (meth) acrylates such as pentaerythritol tri (meth) acrylate, etc.

As the copolymerizable prepolymers, there are included (meth)acrylates of polyesterpolyols, (meth)acrylates of polyetherpolyols, adducts of (meth)acrylic acid to polyepoxides, and resins in which hydroxy(meth)acrylates are introduced into polyols through polyisocyanates, etc.

The above-mentioned copolymerizable vinyl monomers and/or copolymerizable prepolymers can be mixed in an amount ranging from 0 to 100 parts by weight, preferably from 0 to 50 parts by weight based on the (meth)acrylic resin having unsaturated groups.

In the case when the amount of the copolymerizable vinyl monomers and/or copolymerizable prepolymers exceeds 100 parts by weight, there become poor properties in the photo-setting colored filter composition of the present invention.

As examples of photo-initiators, there are specifically exemplified acetophenone, benzophenone, benzyldimethylketal, benzoyl peroxide, ortho-benzoyl methyl benzoate, 4-dimethylaminoethyl benzoate (Kayacure EPA manufactured by Nihon Kayaku, Ltd.), 2,4-diethylthioxanthone (Kayacure DETX manufactured by Nihon Kayaku, Ltd.), 2-methyl-1-[4-(methyl)phenyl]-2-morphorinopropane-1(Irgacure 907 manufactured by Ciba-Geigy, AG), tetra(t-butylperoxycarbonyl)benzophenone, benzyl, 2-hydroxy-2-methyl-1-phenylpropane-1-on, 4,4-bisdiethylaminobenzophenone, 2,2'-bis(2-chlorophenyl)-4, 5,4',5'-tetraphenyl-1,2'-biimidazole (B-CIM manufactured by Hodogaya Chemical, Ltd. Furthermore, accelerators can be employed together with the photo-initiators.

As coloring materials in a color filter according to the present invention, although dyestuffs and pigments may be employed, pigments are preferably employed from a viewpoint of an excellent thermal and light stability.

As the specific examples of the pigments having an excellent thermal and light stability, there are exemplified inorganic pigments such as barium sulfate, zinc flower, lead sulfate, titanium oxide, chrome yellow, red iron oxide, ultramarine blue, prussian blue, chromium oxide, carbon black, and organic pigments such as azo compounds, phthalocyanine compounds, quinacridone compounds, anthraquinone compounds, perylene, perionone, thioindigo compounds, dioxazine compounds, isoindolenone, quinophthalone, and triphenyl methane which are named by the trade names Benzidine Yellow G, Benzidine Yellow GR, Lithol Fast Orange 3GL, Vulcan Fast Orange GC, Pigment Scarlet 3B, Thioindigo maroon, Phthalocyanine Blue, Phthalocyanine Green, Indanthrene Blue, Green Gold, and Malachite Green lake, etc.

Examples of the pigments for use in the colored filter composition in a color filter according to the present invention are preferably exemplified in terms of the Color Index (C.I.) Numbers;

Pigment Yellow: C.I. Nos. 20, 24, 86, 93, 109,110, 117, 125, 137, 138, 147, 148, 153, 154, 166, 168

Pigment Orange: C.I. Nos. 36, 43, 51, 55, 59, 61

Pigment Red : C.I. 9, 97, 122, 123, 149, 168, 177, 180, 192, 215, 216, 217, 220, 223, 224, 226, 227, 228, 240

Pigment Violet: C.I. Nos. 19, 23, 29, 30, 37, 40, 50

Pigment Blue : C.I. Nos. 15, 15.6, 22, 60, 64

Pigment Green: C.I. Nos. 7, 36

Pigment Brown: C.I. Nos. 23, 25, 26

Pigment Black: C.I. No. 7 and titanium black.

The coloring materials to be employed in the photo-setting colored filter composition according to the present invention is required to have a linear particle size which is sufficiently small compared to the range of the wavelength of visible light and which is thus preferably less than 0.3 micron or so, more preferably 0.1 micron. More specifically, the coloring materials preferably contain more than 50% by weight of particle size of less than 0.3 micron and do not contain more than 5% by weight of particles having more than 1 micron from a viewpoint of clarity or transparency of color filter and dispersibility of the coloring materials.

In the case when the coloring materials contain particles less than 0.3 micron in the content of less than 50%, or contain particles having more than 1 micron in the content of more than 5% by weight, those are not preferred for the color filter which especially requires excellent transparency.

The amount of the coloring materials generally ranges from 0.1 to 3 parts by weight, preferably 0.5 to 2 parts by weight based on 1 part by weight of the (meth)acrylic resin having unsaturated groups in the photo-setting colored filter composition.

In the case when the amount of the coloring materials is below 0.1 part by weight, the thickness of filter film must be increased for the purpose of attaining a desired optical density through the color filter, resulting in incapability of precisely forming the filter film. On the other hand, in the case when the amount of the coloring materials exceeds 3 parts by weight, there become poor the dispersibility of the coloring materials and the applicability of the photo-setting colored filter composition onto the surface of a substrate.

Furthermore, there can be optionally employed dispersants for the purpose of uniformly distributing the coloring materials in the photo-setting colored filter composition.

As the dispersants, there are included a variety of surface active agents such as Acetamine 24, Acetamine 86, and Kotamine 86P conc. which are cationic surface agents manufactured by Kao, Ltd., Demole P, Demole EP, Homogenol M-8, Homogenol L-18, Homogenol 1-95, Homogenol L-100 which are anionic surface active agents manufactured by Kao, Ltd., Emulgen A-60, Rheodole SP-L10, Rheodole SP-010, Emusol L-10H, Emusol S-20 which are nonionic surface active agents manufactured by Kao, Ltd., and derivatives of the above-mentioned pigments.

Furthermore, as the dispersants, there can be also employed a polylactone having amino groups represented by general formula (XX)

wherein R is a residual group of an aliphatic, alicyclic, and aromatic hydrocarbon, the atom N may form a ring together with said R which may have a substituent group, at least one of $R^{a1}, R^{a2}, \ldots R^{ak}, R^{b1}, R^{b2}, \ldots R^{bk}$ are a substituent group represented by general formula (XXI)

wherein $R^1$ is a hydrogen or methyl group, $R^3$ is a residual group of an aliphatic or aromatic hydrocarbon having a carbon number ranging from 1 to 10, polypropyleneoxy units or polyethyleneoxy units which may have substituent groups, $R^3$ is an alkylene unit having a carbon number ranging from 3 to 10 which may have side chains having a carbon number ranging from 1 to 5, n pieces of $R^3$ may be identical or different from each other, n is a number ranging from 1 to 100 on an average, and other $R^{a1}, R^{a2}, \ldots R^{ak}, R^{b1}, R^{b2}, \ldots R^{bk}$ are independently a hydrogen or an alkyl group having a carbon number ranging from 1 to 10, k is an integer ranging from 1 to 5.

Still further, there can be also employed a compound having amino groups prepared by the reaction of a polyester compound represented by general formula (XXII)

$$X-Y-R^4 \quad (XXII)$$

wherein X is a structural unit having a functional group capable of reacting with amino groups by a Michaels addition reaction at terminal, $R^4$ is an alkyl group having a carbon number ranging from 1 to 20, an aromatic group, hydroxyl group, cyano group, and halogen atom, and Y is a structural unit having a polyester chain derived from a lactone compound represented by general formula wherein $R^3$ is an alkylene group having a carbon number ranging from 1 to 10 which may be substituted by an aliphatic alkyl group having a carbon number ranging from 1 to 20, with a polyamine compound.

The polylactone having amino groups and the compound having amino groups are detailedly disclosed in EP Patent Application No. 95402635.7 (corresponding to JP-A-06311302 and JP-A-06311303).

The dispersants for the coloring materials are employed in an amount ranging from 0.005 to 1 part by weight, preferably from 0.01 to 0.2 part by weight based on the 1 part by weight of coloring materials.

According to a second aspect of the present invention, there is provided a color filter comprising;
 a) a substrate having a surface portion, wherein said substrate is formed of a transparent material selected from the group consisting of glass and synthetic resin; and
 b) a multiplicity of color filter elements distributed in a predetermined pattern on said surface portion of said substrate, each of the color filter elements being formed of a photo-setting colored filter composition containing a (meth)acrylic resin having unsaturated groups obtained by a reaction of a resin having carboxylic groups with a compound having an alicyclic epoxy group and a (meth)acrylic group, a coloring material and a dispersant.

Figure 1:
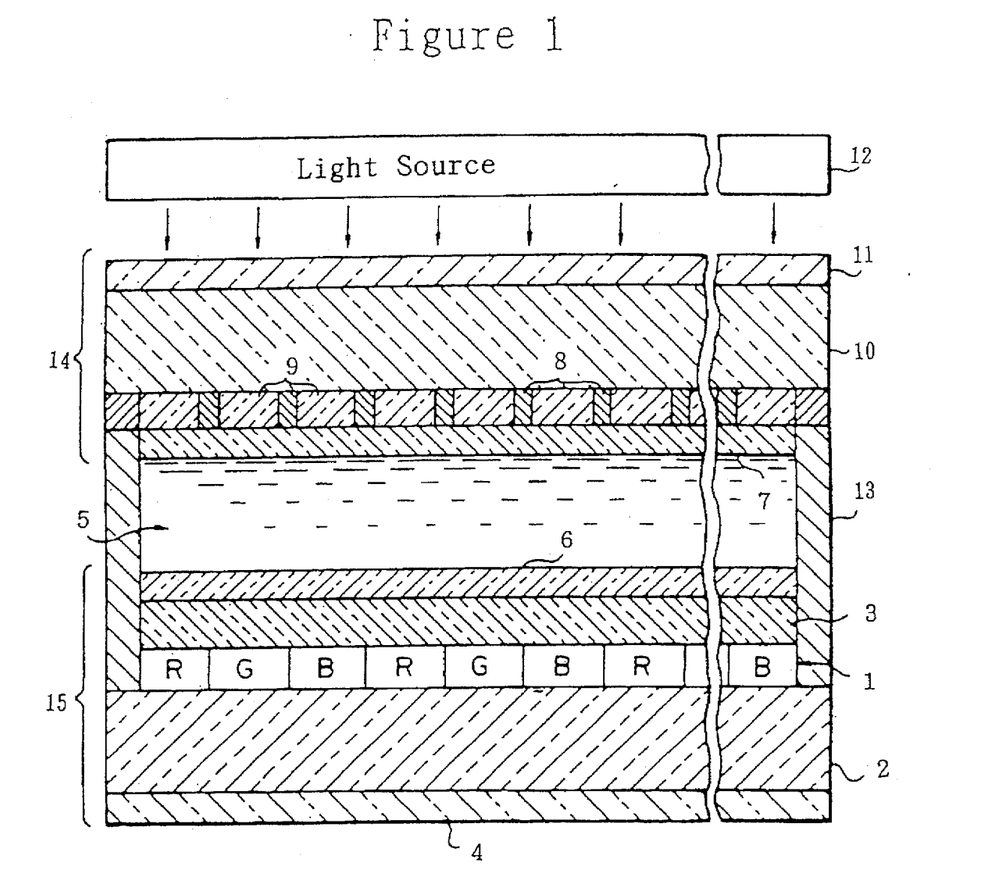
FIG. 1 is a fragmentary cross sectional view exhibiting the configuration of an example of a multi-color liquid-crystal display panel structure in which there can be employed a color filter according to the present invention.

FIG. 1 is a fragmentary cross sectional view exhibiting the configuration of an example of a multi-color liquid-crystal display panel structure which mainly consists of an active-matrix assembly 14, a layer of liquid crystals 5, and a common electrode assembly 15.

In the following, there is detailedly described an arrangement of components in the multi-color liquid-crystal display panel structure based on the FIG. 1.

In the FIG. 1, 1 is a mosaic array of color filter elements arranged in registry with pixel electrodes 9, 2 is a transparent substrate on which there is coated a photo-setting colored filter composition to form the mosaic array of color filter elements 1, 3 is a common electrode opposite to a second orientated film 6, 4 is a second linearly polarized film, 5 is a layer of liquid crystals sandwiched between oriented films 6 and 7 which is hermetically sealed off by a layer of sealant 13, 8 is semiconductor switching devices, 9 is pixel electrodes are respectively associated with the individual switching devices 8, 10 is a first active-matrix substrate, 11 is a first linearly polarized film, 12 is a device for illuminating light, 14 is an active-matrix assembly, and 15 is a common electrode assembly. In the mosaic array of the color filter elements 1, R, G, and B exhibit patterned red-, green-and blue-colored matrixes, respectively. The mosaic array of the color filter elements 1 is interposed between the common electrodes 3 and a second transparent substrate 2 having a second linear polarizer film 4 attached to the outer face of the substrate 2.

The active matrix assembly 14 is composed of a first transparent substrate 10 and a first linear polarizer film 11 attached to the outer face of the substrate 10. The first substrate 10 is usually prepared by glass plate or transparent synthetic resin plate or film. To the inner face of the first substrate 10, there is attached an active layer composed of a multiplicity of transparent pixel electrodes 9 and semiconductor switching devices 8 usually implemented by thin-film field-effect transistors.

The pixel electrodes 9 are respectively associated with the individual switching devices 9 to form a multiplicity of pixel elements arranged in rows and columns in the active layer. An orientation film 7 is attached to the face of the active layer opposite to the active matrix substrate 10.

In the active layer, there are included conductor strips forming signal and scanning lines electrically connected to the pixel electrodes 9 and semiconductor switching devices 8.

On the other hand, the common electrode assembly 15 is composed of a transparent electrode 3 and a second orientation film 6 attached to the inner face of the electrode 3.

The layer of the liquid crystals 5 is sandwiched between the first and second orientation films 7 and 6, and is hermetically sealed off by a layer of sealant 13.

An two-dimensional mosaic array of color filter elements 1 arranged in registry with the pixel electrodes 9 is attached to the face of the common electrodes 3 opposite to the second orientation film 6, respectively. The two-dimensional mosaic array of color filter elements 1 is interposed between the common electrode 3 and a second transparent substrate 2 having a second linear polarizer film 4 attached to the outer face of the substrate 2. The substrate 2 is usually composed of glass plate or transparent synthetic resin plate or film.

Furthermore, there is detailedly described a mechanism of the multi-color liquid-crystal display panel structure which mainly consists of an active-matrix assembly 14, a layer of liquid crystals 5, and a common electrode assembly 15.

The device 12 for illuminating light such as a fluorescent lamp is positioned in the vicinity of the linearly polarized film 11 as a light source.

Light irradiated from the illuminating device 12 is transmitted through the first linearly polarized film 11, first substrate 10, and the active layer formed by the transparent pixel electrodes 9 and the semiconductor switching devices 8.

Subsequently, the light passes through the first oriented film 7 and is admitted into the Layer of liquid crystals 5.

After the light passed through the layer of liquid crystals 5 of liquid crystals, the light is transmitted through the second oriented film 6 and the transparent electrode 3 into the array of the color filter elements 1, and the light is decomposed into three-color components. The three-color components of the light are transmitted through the second substrate 2 and second linear polarized film 4, whereby the three-color components of the light are perceived as a multi-color image by an observer of the color display device.

According to a third aspect of the present invention, there is provided a process for the preparation of a color filter which comprises the steps of;

(a) mixing a (meth)acrylic resin having unsaturated groups obtained by a reaction of a resin having carboxylic groups with a compound having an alicyclic epoxy group and a (moth)acrylic group, coloring materials, and additionally copolymerizable monomers and/or prepolymers, dispersants, and a solvent to prepare a dispersed liquid, (b) adding photo-initiators to the dispersed liquid to produce a photo-setting colored filter composition, (c) forming a layer of the colored filter composition on the surface of a transparent substrate, (d) selectively exposing the layer to photo-energy and developing the resultant layer for forming a multiplicity of discrete filter regions of the photo-setting colored filter composition distributed in a desired pattern on the surface of the transparent substrate.

In the following, there is described in detail a process for the preparation of a color filter according to the present invention.

First of all, in the step (a), there are mixed a (meth)acrylic resin having unsaturated groups obtained by a reaction of a resin having carboxylic groups with a compound having an alicyclic epoxy group and a (meth)acrylic group, a coloring material, and optionally dispersants for the coloring material, copolymerizable monomers and/or prepolymers, and a solvent.

Subsequently, in the step (b), photo-initiators are added to the resultant solution to produce a photo-setting colored filter composition.

Subsequently, in the step (c), the colored filter composition is coated on the surface of a transparent substrate to form a layer.

Subsequently, in the step (d), the layer is selectively exposed to photo-energy through a negative- or positive-photographic mask to form a desired pattern, followed by removing uncured parts remained in unexposed portions in order to develop with a diluent aqueous alkali solution. The photographic mask may or may not be brought into contact with the layer.

The removal may be carried out by immersing in the diluent aqueous alkali solution, otherwise, for example, by spraying the solution onto the layer.

Furthermore, heating may be optionally carried out in order to accelerate curing of the exposed parts in the layer before developing.

As the alkalis to be employed in developing, there are exemplified sodium carbonate, trialkylammonium hydroxide, caustic alkalis, amines such as dimethyl benzylamine and triethanol amine, and trialkylammonium halides, etc.

The above-mentioned steps (a) and (d) are repeated for each of the desired colors to form a multi-color filter structure so that the filter structure comprises the transparent substrate and a single layer of differently colored filter elements arranged in any desired groups each consisting of predetermined number of differently colored filter elements.

The (meth)acrylic resin having unsaturated groups in the photo-setting colored filter composition for the color filter prepared according to the present invention acts as a medium for dispersing the coloring materials.

The dispersant in the photo-setting colored filter composition serves in order to prevent condensation of the coloring materials and enable the coloring materials to be uniformly distribution in the (moth)acrylic resin.

The layer having a desired pattern formed on the surface of the substrate has the thickness ranging from 0.5 to 5 microns, preferably from 0.3 to 3.0 microns.

According to a fourth aspect of the present invention, there is provided a curable resin which comprises a (meth)acrylic resin having unsaturated groups obtained by a reaction of a polymer having structural units represented by general formula (I);

wherein $R^1$ is a hydrogen atom or methyl group, $R^2$ is an alkylene radical having a carbon number ranging from 2 to 12, $R^3$ is a divalent radical having a carbon number ranging from 1 to 10, $R^4$ is a hydrocarbon group having a carbon number ranging from 1 to 20 which may be branched, n is an integer ranging from 1 to 20, and m is an integer ranging from 1 to 5, with a compound having an alicyclic epoxy group and a (meth)acrylic group.

According to a fifth aspect of the present invention, there is provided a curable resin composition which comprises a curable resin of the fourth aspect, a radical polymerization initiator or a photo-initiator and, optionally copolymerizable monomers and/or oligomers.

The (meth)acrylic resin having unsaturated groups in the fourth aspect of the present invention is basically similar to the (meth)acrylic resin having unsaturated groups in the first aspect of the present invention.

The resin of the fourth aspect is different from the resin of the first aspect only in essentially including a resin having the structural units represented by the general formula (I).

Accordingly, conditions for preparing the resin of the fourth aspect are identical to the conditions described in the first aspect except essentially employing a resin having the structural units represented by the general formula The (meth)acrylic resin having unsaturated groups in the curable resin of the fourth aspect preferably has a number average molecular weight ranging from 1,000 to 50,000, and an acid value ranging from 10 to 200, double bonds ranging from 1.0 to 3.5 based on 1 kg of the (meth)acrylic resin.

Furthermore, the curable resin composition of the fifth aspect of the present invention is different from the photosetting colored filter composition of the first aspect only in essentially including a resin having the structural units represented by the general formula (I) and not including coloring materials.

In the following, although the present invention specifically illustrated below by Examples, it is not limited by the Examples.

PREPARATION EXAMPLE 1

<Preparation No. 1 of a curable resin>

A 2-liter glass-made separable flask equipped with an agitator, a thermometer, a reflux cooler, a dropwise funnel, and a tube for blowing air was charged with 225 g of propyleneglycol monomethylether [MMPG manufactured by Daicel Chemical Industries, Ltd.], 225 g of methylpropyleneglycol acetate [MMPGAC manufactured by Daicel Chemical Industries, Ltd.], 11.0 g of t-butylperoxy-2-ethylhexanate [Perbutyl O manufactured by Nihon Yushi, Ltd.].

After raising temperature to 95° C., 214.8 g of methacrylic acid, 225.5 g of butyl acrylate, 8.8 g of 2,2'-azobis (2-methylbutyronitrile) [ABN-E manufactured by Nihon Hydrazine Industries, 135 g of MMPG, and 135 g of MMPGAC were added dropwise together over 3 hours, followed by aging for 4 hours to obtain a solution of a resin having carboxylic groups which is a main polymer.

Subsequently, 339.7 g of 3,4-epoxycyclohexylmethyl methacrylate [Cyclomer M100 manufactured by Daicel Chemical Industries, Ltd., which is referred to as CYM M100 in Table] as a compound having an alicyclic epoxy group and a (meth)acrylic group, 10.2 g of triphenylphosphine, 1.5 g of methylhydroquinone were added into the solution to allow to react at 100° C. for 10 hours in atmosphere of a mixed gas composed of air and nitrogen to obtain a solution of a curable resin having an acid value of 55 KOHmg/g, double bond equivalent [the weight of a resin (g) per 1 mol of unsaturated group] of 450, a number average molecular weight of 7,000.

The curable resin is designated as Resin A.

PREPARATION EXAMPLE 2

<Preparation No. 2 of a curable resin>

The same procedures were repeated as in Preparation Example 1 so that there is obtained a curable resin having an acid value of 100 KOHmg/g and double bond equivalent of 450.

The curable resin is designated as Resin B.

PREPARATION EXAMPLE 3

<Preparation No. 3 of a curable resin>

The same procedures were repeated as in Preparation Example 1, except that 3,4-epoxycyclohexylmethyl methacrylate was changed to 3,4-epoxycyclohexylmethyl acrylate [Cyclomer A200 manufactured by Daicel Chemical Industries, Ltd., which is referred to as CYM A200 in Table] so that there is obtained a curable resin having an acid value and double bond equivalent shown in Table 1.

The curable resin is designated as Resin C.

PREPARATION EXAMPLE 4

<Preparation No. 4 of a curable resin>

The same procedures were repeated as in Preparation Example 1, except that there were employed methacrylic acid, a lactone-modified 2-hydroxyethyl methacrylate modified by a succinic acid FM1A manufactured by Daicel Chemical Industries, Ltd.], and butylacrylate so that there is obtained a curable resin having an acid value and double bond equivalent shown in Table 1.

The curable resin is designated as Resin D.

COMPARATIVE PREPARATION EXAMPLE 1

<Preparation No. 5 of a curable resin>

The same procedures were repeated as in Preparation Example 1, except that there were employed methacrylic acid and butyl acrylate so that there is obtained a curable resin having an acid value of 55 KOHmg/g.

The curable resin is designated as Resin E.

TABLE 1

| Resin | Monomer | Compound | AV | DE |
| --- | --- | --- | --- | --- |
| A | MAA + BA | CYM M100 | 55 | 450 |
| B | MAA + BA | CYM M100 | 100 | 450 |
| C | MAA + BA | CYM A200 | 55 | 450 |
| D | MAA + FM1A + BA | CYM M100 | 55 | 450 |
| E | MAA + BA | None | 55 | 0 |

In the Table 1, abbreviations are as follows.

Resins A–D: Curable resin [a (meth)acrylic resin having unsaturated groups]

Resin E: (meth)acrylic resin

Monomer: Monomer composition in a main polymer

Compound: Compound having an unsaturated group and an alicyclic epoxy group added to a main polymer AV : Acid Value (KOHmg/g)

DE : Double bond equivalent

MAA : Methacrylic acid

BA : Butyl acrylate

FM1A : Lactone-modified 2-hydroxyethyl methacrylate modified by a succinic acid

EXAMPLE 1

<Preparation of a photo-setting colored (red) filter composition>

There were sufficiently mixed 12.56 parts by weight of the Resin A obtained in Preparation Example 1, 7.20 parts by weight of Lyotgen Red GD (Pigment Red having C.I. No. 168, manufactured by Toyo Ink, Ltd.) as a coloring material, 2.40 parts by weight of Lyonogen Yellow 3G (Pigment Yellow having C.I. No. 154, manufactured by Toyo Ink, Ltd.) as coloring materials, 0.51 part by weight of Emulgen A-60 (manufactured by Kao, Ltd.) as a dispersant, and 42.89 part by weight of methylpropyleneglycol acetate in a sand mill to prepare a red colored paste.

Subsequently, there were mixed 65.56 parts by weight of the red colored paste, 3.56 parts by weight of trimethylolpropane triacrylate (NK Ester manufactured by Shin-Nakamura Kagaku, Ltd.), 0.12 part by weight of Irugacure 907 (manufactured by Ciba-Geigy, AG.), 0.12 part by weight of Kayacure DETX (manufactured by Nihon Kayaku, Ltd.), 0.06 part by weight of Kayacure EPA (manufactured by Nihon Kayaku, Ltd.), and 31.83 part by weight of methylpropyleneglycol acetate in a vessel capable of mixing to prepare a photo-setting colored (red) filter composition having the non-volatile components of 20%.

EXAMPLE 2

<Preparation of a photo-setting colored (green) filter composition>

There were sufficiently mixed 13.62 parts by weight of the Resin A obtained in Preparation Example 1, 8.91 parts by weight of Lyonol Green 2YS (Pigment Green having C.I. No. 36, manufactured by Toyo Ink, Ltd.), 1.65 parts by weight of Lyonogen Yellow 3G (Pigment Yellow having C.I. No. 154, manufactured by Toyo ink, Ltd.) as coloring materials, 0.55 part by weight of Emulgen A-60 (manufactured by Kao, Ltd.) as a dispersant, and 46.95 part by weight of methylpropyleneglycol acetate in a sand mill to prepare a green colored paste.

Subsequently, there were mixed 71.68 parts by weight of the green colored paste, 3.90 parts by weight of trimethylolpropane triacrylate (NK Ester manufactured by Shin-Nakamura Kagaku, Ltd.), 0.18 part by weight of Irugacure 907 (manufactured by Ciba-Geigy, AG.), 0.18 part by weight of Kayacure DETX (manufactured by Nihon Kayaku, Ltd.) as a photo-initiator, 0.09 part by weight of Kayacure EPA (manufactured by Nihon Kayaku, Ltd.) as a photo-initiator, and 47.69 parts by weight of methylpropyleneglycol acetate in a vessel capable of mixing to prepare a photo-setting colored (green) filter composition having the non-volatile components of 20%.

EXAMPLE 3

<Preparation of a photo-setting colored (blue) filter composition>

There were sufficiently mixed 13.54 parts by weight of the Resin A obtained in Preparation Example 1, 5.66 parts by weight of Lyonogen Blue ES (Pigment Blue having C.I. No. 15:6, manufactured by Toyo Ink, Ltd.), 1.42 parts by weight of Lyonogen Violet RL (Pigment Violet having C.I. No. 23, manufactured by Toyo Ink, Ltd.) as coloring materials, 0.40 part by weight of Emulgen A-60 (manufactured by Kao, Ltd.) as a dispersant, and 37.40 part by weight of methylpropyleneglycol acetate in a sand mill to prepare a blue colored paste.

Subsequently, there were mixed 59.84 parts by weight of the blue colored paste, 4.30 parts by weight of trimethylolpropane triacrylate (NK Ester manufactured by Shin-Nakamura Kagaku, Ltd.), 0.22 part by weight of Irugacure 907 (manufactured by Ciba-Geigy, AG.) as a photo-initiator, 0.22 part by weight of Kayacure DETX (manufactured by Nihon Kayaku, Ltd.) as a photo-initiator, 0.11 part by weight of Kayacure EPA (manufactured by Nihon Kayaku, Ltd.), and 34.32 parts by weight of methyl-propyleneglycol acetate in a vessel capable of mixing to prepare a photo-setting colored (blue) filter composition having the non-volatile components of 20%.

EXAMPLE 4

<Preparation No. 1 of a color filter>

The photo-setting colored (red) filter composition prepared in Example 1 was precisely filtered with a strainer having the diameter of 1 micron, followed by coating it onto a glass-made substrate on which black-matrixed patterns are already formed with a spin coater so that the thickness of the coating layer is adjusted to 1.3 micron after evaporation of solvents.

Subsequently, an aqueous polyvinyl alcohol solution was coated with a spin coater after prebaking at 60° C. for 20 minutes, followed by drying water. Then, a photographic mask having a multiplicity of rectangular apertures distributed in a pattern conforming to the pattern of distribution of the red-colored pixel elements was placed on the coated layer of the photo-setting colored (red) filter composition.

The layer of the photo-setting colored (red) filter composition was selectively exposed to light with an exposure intensity of 1200 mJ/cm$^2$ through the apertures in the photographic mask with the use of an ultra-high pressure mercury lamp as the source of the light.

Subsequently, the layer of the photo-setting colored (red) filter composition thus selectively exposed to light was developed by the use of 1.0% of sodium carbonate aqueous solution to remove uncured portion's, followed by washing with pure water and post baking at 230° C for 1 hour.

The same processes were followed for the green- and blue-colored photo-setting filter composition to form a single layer of black-, red-, green-, and blue-colored discrete filter elements fixed on the surface of the substrate.

The layer of the filter elements was then coated with a 5% solution of a melamine-epoxy copolymer (manufactured by Toyo Ink, Ltd. ).

EXAMPLES 5–9 AND COMPARATIVE EXAMPLE 1

<Preparation Nos. 5–9 and Comparative preparation No. 1 of a color filter>

The same procedures were repeated as in Example 1, except that there were employed curable resins, monomers, photo initiators shown in Table 2 to prepare color filters.

TABLE 2

|  | Example | | | | | Comparative Example |
|---|---|---|---|---|---|---|
|  | 5 | 6 | 7 | 8 | 9 | 1 |
| Resin | A | A | B | C | D | E |
| Monomer | ATMPT | DPHA | DPHA | DPHA | DPHA | DPHA |
| Photo initiator (1) | 907 | 907 | 907 | 907 | 907 | 907 |
| Photo initiator (2) | DETX | DETX | DETX | DETX | DETX | DETX |
| Photo initiator (3) | EPA | EPA | EPA | EPA | EPA | EPA |

In the Table 2, abbreviations are as follows.

ATMPT: Trimethylolpropane triacrylate [(NK Ester) manufactured by Shin Nakamura Kagaku, Ltd.)

DPHA: Kayarad [manufactured by Nihon Kayaku, Ltd.]

907: Irugacure 907 [manufactured by Ciba-Geigy, AG.]

DETX: Kayacure DETX [manufactured by Nihon Kayaku, Ltd.]

EPA : Kayacure EPA [manufactured by Nihon Kayaku, Ltd.]

In the Table 2, photo initiator (1), photo initiator (2), and photo initiator (3) are employed in the weight ratio of 2:2:1.

Properties of the color filters prepared in Examples 5–9 and Comparative Example 1 were evaluated, and results are shown in Table 3.

TABLE 3

| | Example | | | | | | | | | | | | | | | Comparative Example | | |
|---|---|---|---|---|---|---|---|---|---|---|---|---|---|---|---|---|---|---|
| | 5 | | | 6 | | | 7 | | | 8 | | | 9 | | | 1 | | |
| Tackiness | O | | | O | | | O | | | O | | | O | | | Δ | | |
| Resolution (micron) | R | G | B | R | G | B | R | G | B | R | G | B | R | G | B | R | G | B |
|  | 4 | 5 | 4 | 4 | 5 | 4 | 13 | 15 | 14 | 4 | 5 | 4 | 4 | 5 | 4 | 35 | 40 | 38 |
| Transmittance (average %) | 97 | | | 95 | | | 95 | | | 96 | | | 95 | | | 94 | | |
| Thermal stability | O | | | O | | | O | | | O | | | O | | | Δ | | |
| Chemical resistance | O | | | O | | | Δ | | | O | | | O | | | X | | |

Evaluation methods of the properties are as follows.

Tackiness: Coated layer formed with a spin coater was dried, and then it was exposed to an ultraviolet ray of an intensity of 40 $mJ/cm_2$ through a test chart having line and space pattern of from 0.5 to 50.0 microns placed on the coated layer. Subsequently, there was visually observed photo-setting colored filter composition adhered on the surface of the test chart.
O: none of tackiness, Δ: slight tackiness,
X: remarkable tackiness Resolution: Coated layer formed with a spin coater was dried, and then it was exposed to an ultraviolet ray of an intensity of 40 $mJ/cm_2$ through a test chart having line and space pattern of from 0.5 to 50.0 microns placed on the coated layer. Subsequently, resolution was measured after immersing for 60 seconds for developing with an aqueous solution containing 1% of sodium carbonate.

Transmittance: The same coated layer prepared as in the resolution test was heated in a circulating dryer maintained at 230° C. for 60 minutes. Transmittance of cured layer prepared was measured with an optical analyzer (manufactured by Nihon Bunko, Ltd.).

Light having wavelength of 510, 540, and 460 nano meter was employed for the red-colored, green colored, and blue colored pixel, respectively.

Thermal stability: The same coated layer prepared as in the transmittance test was heated in a convecting dryer maintained at 250° C. for 60 minutes. Transmittance after heating was compared to transmittance before heating.
O: less than 5%, Δ: 5 to 10%, X: more than 10%

Chemical resistance: Coated layer after cured was immersed into (a) isopropyl alcohol, (b) cyclohexanone, (c) diglime, (d) acetone, (e) butyl acetate, and (f) 5% NaOH aqueous solution, respectively, for 30 minutes to visually observe the presence or absence of boundary line at immersed portion.
O: boundary line was not observed, Δ: boundary line was slightly observed, X: boundary lines were remarkably observed.

EXAMPLE 10

<Preparation No. 1 of a curable resin which comprises a (meth)acrylic resin having unsaturated groups>

A 2-liter glass-made separable flask equipped with an agitator, a thermometer, a reflux cooler, a dropwise funnel, and a tube for blowing air was charged with 750 g of dipropyleneglycol monomethylether [MFDG manufactured by Nihon Nyukazai, Ltd.], 17.9 g of t-butylperoxy-2-ethylhexanate [Perbutyl O, manufactured by Nihon Yushi, Ltd.].

After raising temperature to 90° C., 241.4 g of methacrylic acid, 205.4 g of a lactone-modified 2-hydroxyethyl methacrylate modified by a succinic acid [Placcel FM1A, manufactured by Daicel Chemical Industries, Ltd.], and 17.9 g of 2,2'-azobis(2-methylvaleronitrile) [ABN-V manufactured by Nihon Hydrazine Industries, Ltd.]were added dropwise together to dipropylene glycol monomethylether over 3 hours while streaming nitrogen gas, followed by aging for 6 hours to obtain a solution of a resin having carboxylic groups which is a main polymer.

Subsequently, 303.3 g of 3,4-epoxycyclohexylmethyl acrylate [Cyclomer A200, manufactured by Daicel Chemical Industries, Ltd.] as a compound having an alicyclic epoxy group and a (meth)acrylic group, 3.03 g of triphenylphosphine, 1.5 g of hydroquinone monomethylether were added into the solution to allow to react at 100° C. for 10 hours while streaming air to obtain a solution of a curable resin having an acid value of 76.5 KOHmg/g, a viscosity of 46200 cp/25° C., a solid content of 55.4%, a double bond equivalent [unsaturated group per 1 kg of the resin] of 2.22 mol, a number average molecular weight (based on a Standard Polystyrene) of 6,700.

The curable resin is designated as Resin A'.

EXAMPLE 11

<Preparation No. 2 of a curable resin which comprises a (meth)acrylic resin having unsaturated groups>

A 2-liter glass-made separable flask equipped with an agitator, a thermometer, a reflux cooler, a dropwise funnel, and a tube for blowing air was charged with 750 g of dipropyleneglycol monomethylether, 19.1 g of t-butylperoxy-2-ethylhexanate [Perbutyl O manufactured by Nihon Yushi, Ltd.].

After raising temperature to 90° C., 212.1 g of methacrylic acid, 265.0 g of a lactone-modified 2-hydroxyethyl methacrylate modified by a succinic acid [Placcel FM1A, manufactured by Daicel Chemical Industries, Ltd.], and 19.1 g of 2,2'-azobis(2-methylvaleronitrile) [ABN-V manufactured by Nihon Hydrazine Industries, Ltd.] were added dropwise together to dipropyleneglycol monomethylether over 3 hours while streaming nitrogen gas, followed by aging for 6 hours to obtain a solution of a resin having carboxylic groups which is a main polymer.

Subsequently, 273.0 g of 3,4-epoxycyclohexylmethyl acrylate [Cyclomer A200, manufactured by Daicel Chemical Industries, Ltd.] as a compound having an alicyclic epoxy group and a (meth)acrylic group, 2.7 g of triphenylphosphine, 1.5 g of hydroquinone monomethylether were added into the solution to allow to react at 100° C. for g hours while streaming air to obtain a solution of a curable resin having an acid value of 78.9 KOHmg/g, a viscosity of 45200 cp/25° C., a solid content of 55.0%, a double bond equivalent [unsaturated group per 1 kg of the resin] of 2.00 mol, a number average molecular weight (based on a Standard Polystyrene) of 7,100.

The curable resin is designated as Resin B'.

EXAMPLE 12

<Preparation No. 3 of a curable resin which comprises a (meth)acrylic resin having unsaturated groups>

The same procedures were repeated as in Example 10, except that 3,4-epoxycyclohexylmethyl acrylate was changed to 326.6 g of 3,4-epoxycyclohexylmethyl methacrylate [Cyclomer M100, manufactured by Daicel Chemical Industries, Ltd.].

The curable resin is designated as Resin C'.

COMPARATIVE EXAMPLE 2

<Comparative Preparation No. 1 of a curable resin not having the structural groups represented by general formula (I)>

The same equipment as used in Example 10 was charged with 917 g of dipropyleneglycol monomethylether, 17.9 g of t-butylperoxy-2-ethylhexanate [Perbutyl O manufactured by Nihon Yushi, Ltd.]. After raising temperature to 90° C., 292.8 g of methacrylic acid, 154.0 g of methylmethacrylate, and 17.9 g of 2,2'-azobis (2-methylvaleronitrile) [ABN-V manufactured by Nihon Hydrazine Industries, Ltd.] were added dropwise together to dipropylene glycol monomethylether over 3 hours while streaming nitrogen gas, followed by aging for 6 hours to obtain a solution of a resin having carboxylic groups which is a main polymer.

Subsequently, 303.3 g of 3,4-epoxycyclohexylmethyl acrylate [Cyclomer A200 manufactured by Daicel Chemical Industries, Ltd.], 3.03 g of triphenylphosphine, 1.7 g of hydroquinone monomethylether were added into the solution to allow to react at 100° C. for 10 hours while streaming air to obtain a solution of a curable resin composition having a viscosity of 46000 cp/25° C., a solid content of 46.8%, a double bond equivalent [unsaturated group per 1 kg of the resin] of 2.22 mol, a number average molecular weight (based on a Standard Polystyrene) of 6,900.

The curable resin is designated as Resin D'.

COMPARATIVE EXAMPLE 3

<Comparative Preparation No. 2 of a curable resin not having the structural groups represented by general formula (I)>

The same procedures were repeated as in Example 11, except that 3,4-epoxycyclohexylmethyl acrylate was changed to 265.0 g of glycidyl methacrylate to obtain a solution of a curable resin.

The curable resin is designated as Resin E'.

EXAMPLE 13

<Curability test No. 1>

There were mixed 100 parts by weight of the Resin A' obtained in Example 10, 20 parts by weight of trimethylolpropane triacrylate, 20 parts by weight of a cresol novolak type resin having an epoxy equivalent of 220 (Epikote 180S70, manufactured by Yuka Shell Epoxy, Ltd.), 7 parts by weight of a benzyl methylketal resin, 2 part by weight of diethyl thioxantone, 1.5, parts by weight of Phthalocyanine Green as a pigment, 5 parts by weight of silica as a pigment, 20 parts by weight of barium sulphate, and 5 parts by weight of dicyandiamide, followed by kneading in a mixing roll equipped with three-rolls to obtain a viscous curable composition. The viscous curable composition obtained was coated with a barcoater on a pattern-formed base plate so that thickness after evaporation of solvents is adjusted to from 20 to 30 microns, followed by drying with a circulation dryer at 80° C. for 20 minutes. Subsequently, a negative-type photographic mask was placed on the coated layer. The layer of the curable resin composition was selectively exposed to light with an exposure intensity of 800 mJ/cm$^2$ through the photographic mask.

Subsequently, the layer of the composition thus selectively exposed to light was developed by the use of 1.0% of sodium carbonate aqueous solution to remove uncured portions, followed by washing with pure water and curing at 150° C. for 30 minutes in a circulation oven to obtain a solder resist.

After placing in room temperatures for one month, there were evaluated a stability of the composition, tackiness of the coated layer after drying, developability, sensitivity, anti-strippability, thermal stability of the coated layer in solder, and hydrolysis resistance. Results are shown in Table 4.

EXAMPLE 14 and 15

<Curability tests No. 2 and 3>

The same curability tests as carried out in Example 13 except that Resins B' and C' were employed in place of Resin A'.

Results are shown in Table 4.

COMPARATIVE EXAMPLES 3 and 4

<Comparative curability tests No. 1 and 2>

The same curability tests as carried out in Example 13 except that Resins D' and E' were employed in place of Resin A'. Results are shown in Table 4.

TABLE 4

|  | Example | | | Comparative Example | |
|---|---|---|---|---|---|
|  | 13 | 14 | 15 | 3 | 4 |
| Stability of the composition | ○ | ○ | ○ | X | ○ |
| Tackiness | ○ | ○ | ○ | ○ | X |
| Developability | ⊙ | ⊙ | ○ | Δ | Δ |
| Sensitivity | 9 | 8 | 8 | 6 | 4 |
| Anti-strippability | ○ | ○ | ○ | ○ | ○ |
| Thermal stability | ○ | ○ | ○ | ○ | X |
| Hydrolysis resistance | ○ | ○ | ○ | ○ | X |

Evaluation methods of the properties are as follows.

Stability of the composition: Compositions were visually observed after placing for one month.
  ○: Separation of pigment was not observed,
  X: Separation of pigment was observed,
Tackiness: Coated layer was dried, followed by touching by fingers.

○: none of tackiness, △: slight tackiness,
X: remarkable tackiness

Developability: by 1% sodium carbonate
⊚: developable within 15 seconds
○: developable in 15–20 seconds
△: developable in 20'30 seconds
X: developable in more than 30 seconds Sensitivity: It was evaluated with 14-steps tablet manufactured by Kodak.

Anti-strippability: It was evaluated by a cross-cut test with a cellophane stick tape according to JIS D0202.
○:100/100, △: 50/100–99/100,
X: 0/100–49/100

Thermal stability of the coated layer in solder: Coated layer was visually observed after immersing in a solder maintained at 260° C. for 20 minutes.
○: coated layer was not changed,
△: coated layer was slightly stripped,
X: coated layer was stripped.

Hydrolysis resistance: Coated layer was visually observed after immersing in warm water maintained at 40° C. for 240 hours.
○: gloss of coated layer was quite not faded,
△: gloss of coated layer was slightly faded,
X: gloss of coated layer was faded.

It is to be noted that in the above Examples, acid values (KOHmg/g) were measured based on JIS No. 1557.

While the invention has been described in detail and with reference to specific embodiments thereof, it will be apparent to one skilled in the art that various changes and modifications can be made therein without departing from the spirit and scope thereof.

What is claimed is:

1. A curable resin which comprises a (meth)acrylic resin having unsaturated groups obtained by a reaction of a polymer having structural units represented by general formula (I);

wherein $R^1$ is a hydrogen atom or methyl group, $R^2$ is an alkylene radical having a carbon number ranging from 2 to 12, $R^3$ is a divalent radical having a carbon number ranging from 1 to 10, $R^4$ is a hydrocarbon group having a carbon number ranging from 1 to 20 which may be branched, n is an integer ranging from 1 to 20, and m is an integer ranging from 1 to 5, with a compound having an alicyclic epoxy group and a (meth)acrylic group.

2. A curable resin as set forth in claim 1, wherein said compound having an alicyclic epoxy group and a (meth)acrylic group is 3,4-epoxycyclohexyl methylacrylate or 3,4-epoxy-cyclohexyl methylmethacrylate.

3. A curable resin as set forth in claim 1, wherein said (meth)acrylic resin having unsaturated groups has a number average molecular weight ranging from 1,000 to 50,000.

4. A curable resin as set forth in claim 1, wherein said (meth)acrylic resin having unsaturated groups has an acid value ranging from 10 to 200.

5. A curable resin as set forth in claim 1, wherein said (meth)acrylic resin having unsaturated groups has double bonds ranging from 1.0 to 3.5 mol based on 1 kg of said (meth)acrylic resin.

6. A curable resin composition which comprises a curable resin as set forth in claim 1, a radical polymerization initiator or a photo-initiator and, optionally copolymerizable monomers and/or oligomers, and solvents.

* * * * *